(12) United States Patent
Tieger et al.

(10) Patent No.: US 8,089,052 B2
(45) Date of Patent: Jan. 3, 2012

(54) ION SOURCE WITH ADJUSTABLE APERTURE

(75) Inventors: Daniel Tieger, Manchester, MA (US); William DiVergilio, Cambridge, MA (US); Edward Eisner, Lexington, MA (US); Michael Graf, Belmont, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 199 days.

(21) Appl. No.: 12/423,066

(22) Filed: Apr. 14, 2009

(65) Prior Publication Data

US 2009/0266997 A1 Oct. 29, 2009

Related U.S. Application Data

(60) Provisional application No. 61/047,528, filed on Apr. 24, 2008.

(51) Int. Cl.
*H01J 49/10* (2006.01)
*H01J 37/317* (2006.01)

(52) U.S. Cl. ............... 250/423 R; 250/424; 250/396 R; 250/492.21; 313/363.1; 315/111.31; 315/111.81

(58) Field of Classification Search .............. 250/423 R, 250/424, 396 R, 492.21; 313/363.1; 315/111.31, 315/111.81
See application file for complete search history.

(56) References Cited

U.S. PATENT DOCUMENTS

| 5,504,340 | A | * | 4/1996 | Mizumura et al. | ........ | 250/492.21 |
| 5,920,076 | A | * | 7/1999 | Burgin et al. | ............ | 250/492.21 |
| 6,331,713 | B1 | * | 12/2001 | Smick et al. | ............... | 250/497.1 |
| 2009/0236547 | A1 | * | 9/2009 | Huang et al. | ............. | 250/492.21 |

* cited by examiner

*Primary Examiner* — Nikita Wells

(74) *Attorney, Agent, or Firm* — Tarolli, Sundheim, Covell & Tummino LLP

(57) ABSTRACT

An ion implanter system including an ion source for use in creating a stream or beam of ions. The ion source has an ion source chamber housing that at least partially bounds an ionization region for creating a high density concentration of ions within the chamber housing. An ion extraction aperture of desired characteristics covers an ionization region of the chamber. In one embodiment, a movable ion extraction aperture plate is moved with respect to the housing for modifying an ion beam profile. One embodiment includes an aperture plate having at least elongated apertures and is moved between at least first and second positions that define different ion beam profiles. A drive or actuator coupled to the aperture plate moves the aperture plate between the first and second positions. An alternate embodiment has two moving plate portions that bound an adjustable aperture.

20 Claims, 4 Drawing Sheets

ION SOURCE WITH ADJUSTABLE APERTURE

CROSS REFERENCE TO RELATED APPLICATION

The present application claims priority from provisional application Ser. No. 61/047,528 filed Apr. 24, 2008 entitled "Ion Source with Adjustable Aperture" which is incorporated herein for all purposes.

FIELD OF THE INVENTION

The present invention relates to an ion implanter having an ion generating source that emits ions to form an ion beam for beam treatment of a workpiece.

BACKGROUND ART

Ion implanters can be used to treat silicon wafers by bombardment of the wafers with an ion beam. One use of such beam treatment is to selectively dope the wafers with impurities of controlled concentration to yield a semiconductor material during fabrication of integrated circuits.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes that energize and direct the flow of ions from the source. The desired ions are separated from byproducts of the ion source in a mass analysis device, typically a magnetic dipole performing mass dispersion of the extracted ion beam. The beam transport device, typically a vacuum system containing an optical train of focusing devices transports the ion beam to the wafer processing device while maintaining desired optical properties of the ion beam. Finally, semiconductor wafers are implanted in the wafer processing device.

Batch ion implanters include a spinning disk support for moving multiple silicon wafers through the ion beam. The ion beam impacts the wafer surface as the support rotates the wafers through the ion beam.

Serial implanters treat one wafer at a time. The wafers are supported in a cassette and are withdrawn one at time and placed on a support. The wafer is then oriented in an implantation orientation so that the ion beam strikes the single wafer. These serial implanters use beam shaping electronics to deflect the beam from its initial trajectory and often are used in conjunction with co-ordinated wafer support movements to selectively dope or treat the entire wafer surface.

Ion sources that generate the ion beams used in existing implanters create ions that are shaped into an appropriate ion beam for wafer treatment. U.S. Pat. No. 5,497,006 to Sferlazzo et al concerns one such ion source. The contents of the '006 patent are incorporated herein by reference for all purposes.

Ions within the chamber migrate from a chamber interior through an aperture that may be in the form of an elongated ion extraction aperture. Existing implanters allow the size of the slit to be changed by replacing a first extraction aperture along one side of the ion source with a second, different shaped ion extraction aperture.

SUMMARY OF THE INVENTION

An ion implanter system including an ion source for use in creating a stream of ions is disclosed. The ion source has an ion source chamber housing that confines a high density concentration of ions within the chamber housing. An appropriately configured aperture allows ions to exit the source chamber. In one embodiment, a movable aperture plate is moved with respect to the housing for modifying an ion beam profile.

In one presently preferred embodiment a plate having at least two openings or apertures is moved between at least first and second positions that define different ion beam profiles. A drive or actuator coupled to the plate moves the plate between the first and second positions.

In modern semiconductor processing, implant steps requiring beam energies of a few keV or less and beam currents of tens of milliamps are common. Typical monomer implant species are Arsenic, Phosphorous and Boron. Proper operation of the extraction and acceleration optics for these high perveance beams requires that the width of the ion extraction aperture be less than about 4 mm. For a typical aperture height of 50 mm, and an extraction current of 50 mA, the ion extraction current density is about 0.25 mA/mm$^2$. In the case of large molecule ion beams, such as decaborane and octadecaborane, the ion source cannot be operated at such high current density as the molecules are dissociated in the high density plasma. Rather, it is found that the maximum ion extraction current density is about 0.01 mA/mm$^2$. For the ion extraction aperture described above, the extracted current for a large molecular species beam would be about 2 mA. However, typical beam energies for these species are tens of keV. For these low perveance beams proper operation of the extraction and acceleration optics can be maintained with much larger aperture widths, e.g. 12 mm. For this example the extraction current would thus be increased to 6 mA, tripling the productivity of the implanter. The above system allows the aperture size to be changed in situ for efficient source operation with either monomer species or large molecule species.

Further features of the present invention will become apparent to those skilled in the art to which the present invention relates from reading the following specification with reference to the accompanying drawings.

EXEMPLARY EMBODIMENT FOR PRACTICING THE INVENTION

Figure 1:
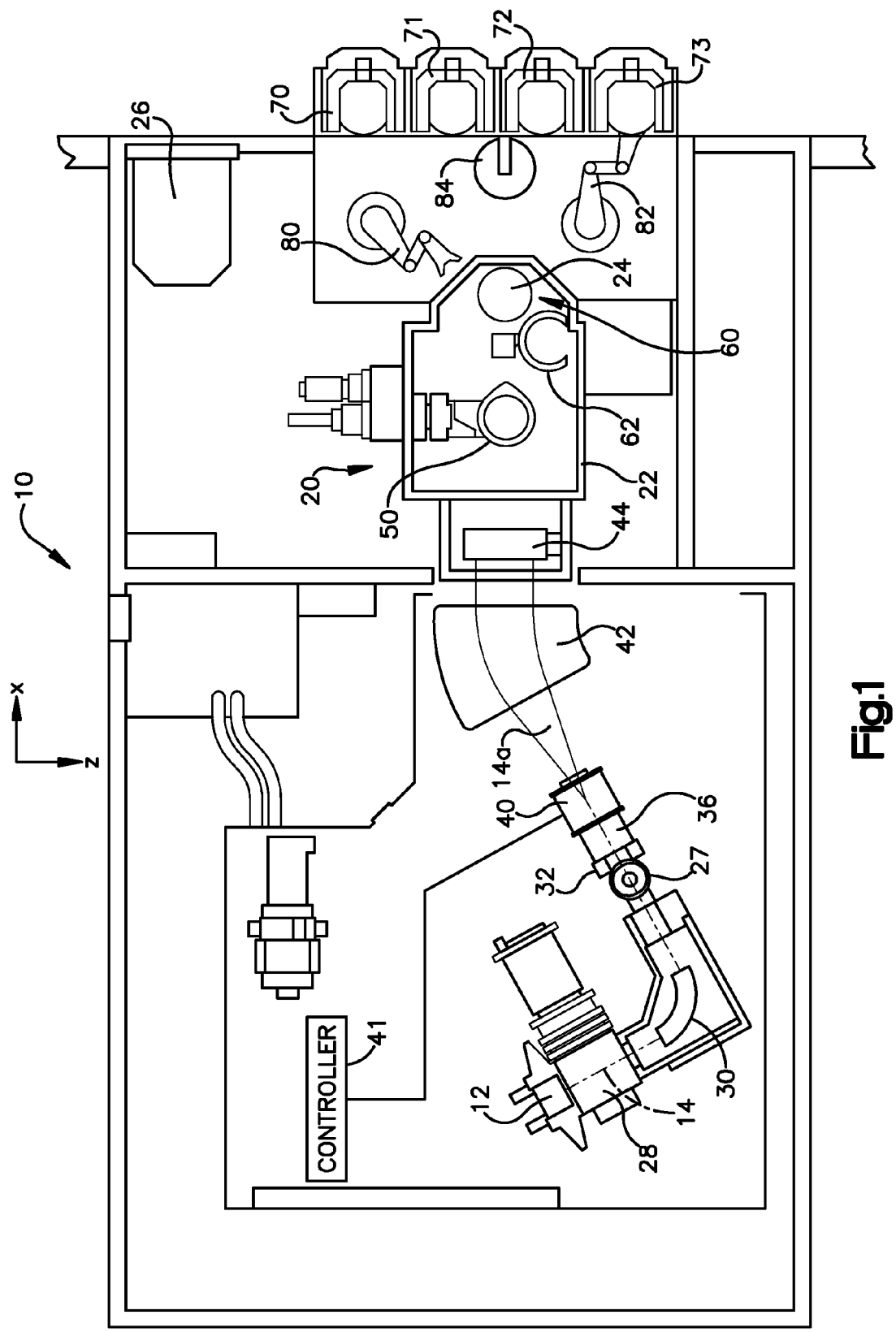
FIG. 1 is schematic view of an ion implanter for ion beam treatment of a workpiece such as a silicon wafer mounted on a spinning support.

Turning to the drawings, FIG. 1 illustrates a schematic depiction of an ion beam implanter 10 having an ion source 12 for creating ions that form an ion beam 14 which is shaped and selectively deflected to traverse a beam path to an end or implantation station 20. The implantation station includes a vacuum or implantation chamber 22 defining an interior region in which a workpiece 24 such as a semiconductor wafer is positioned for implantation by ions that make up the ion beam 14. Control electronics indicated schematically as a controller 41 are provided for monitoring and controlling the ion dosage received by the workpiece 24. Operator input to the control electronics are performed via a user control console 26 located near the end station 20. The ions in the ion beam 14 tend to diverge as the beam traverses a region between the source and the implantation chamber. To reduce this divergence, the region is maintained at low pressure by one or more vacuum pumps 27.

The ion source 12 includes a plasma chamber defining an interior region into which source materials are injected. The source materials may include an ionizable gas or vaporized source material. Ions generated within the plasma chamber are extracted from the chamber by an ion beam extraction assembly 28 which includes a number of metallic electrodes for creating an ion accelerating electric field.

Positioned along the beam path 16 is an analyzing magnet 30 which bends the ion beam 14 and directs it through a beam shutter 32. Subsequent to the beam shutter 32, the beam 14 passes through a quadrupole lens system 36 that focuses the beam 14. The beam then passes through a deflection magnet 40 which is controlled by the controller 41. The controller 41 provides an alternating current signal to the conductive windings of the magnet 40 which in turn cause the ion beam 14 to repetitively deflect or scan from side to side at a frequency of several hundred Hertz. In one disclosed embodiment, scanning frequencies of from 200 to 300 Hertz are used. This deflection or side to side scanning generates a thin, fan shaped ribbon ion beam 14a.

Ions within the fan shaped ribbon beam follow diverging paths after they leave the magnet 40. The ions enter a parallelizing magnet 42 wherein the ions that make up the beam 14a are again bent by varying amounts so that they exit the parallelizing magnet 42 moving along generally parallel beam paths. The ions then enter an energy filter 44 that deflects the ions downward (y-direction in FIG. 1) due to their charge. This removes neutral particles that have entered the beam during the upstream beam shaping that takes place.

The ribbon ion beam 14a that exits the parallelizing magnet 42 is an ion beam with a cross-section essentially forming a very narrow rectangle, that is, a beam that extends in one direction, e.g., has a vertical extent that is limited (e.g. approx ½ inch) and has an extent in the orthogonal direction that widens outwardly due to the scanning or deflecting caused to the magnet 40 to completely cover a diameter of a workpiece such as a silicon wafer.

Generally, the extent of the ribbon ion beam 14a is such that when the wafer is scanned up and down in the y direction the ions impact an entire surface of the workpiece 24. Assume the workpiece 24 has a horizontal dimension of 300 mm. (or a diameter of 300 mm.). The magnet 40 will deflect the beam such that a horizontal extent of the ribbon ion beam 14a, upon striking the implantation surface of the workpiece 24 within the implantation chamber 22, will be at least 300 mm.

A workpiece support structure 50 both supports and moves the workpiece 24 (up and down in the y direction) with respect to the ribbon ion beam 14 during implantation. Since the implantation chamber interior region is evacuated, workpieces must enter and exit the chamber through a loadlock 60. A robotic arm 62 mounted within the implantation chamber 22 automatically moves wafer workpieces to and from the loadlock 60. A workpiece 24 is shown in a horizontal position within the load lock 60 in FIG. 1. The arm 62 moves the workpiece 24 from the load lock 60 to the support 50 by rotating the workpiece through an arcuate path. Prior to implantation, the workpiece support structure 50 rotates the workpiece 24 to a vertical or near vertical position for implantation. If the workpiece 24 is vertical, that is, normal with respect to the ion beam 14, the implantation angle or angle of incidence between the ion beam and the normal to the workpiece surface is 0 degrees.

In a typical implantation operation, undoped workpieces (typically semiconductor wafers) are retrieved from one of a number of cassettes 70-73 by one of two robots 80, 82 which move a workpiece 24 to an orienter 84, where the workpiece 24 is rotated to a particular orientation. A robot arm retrieves the oriented workpiece 24 and moves it into the load lock 60. The load lock closes and is pumped down to a desired vacuum, and then opens into the implantation chamber 22. The robotic arm 62 grasps the workpiece 24, brings it within the implantation chamber 22 and places it on an electrostatic clamp or chuck of the workpiece support structure 50. The electrostatic clamp is energized to hold the workpiece 24 in place during implantation. Suitable electrostatic clamps are disclosed in U.S. Pat. No. 5,436,790, issued to Blake et al. on Jul. 25, 1995 and U.S. Pat. No. 5,444,597, issued to Blake et al. on Aug. 22, 1995, both of which are assigned to the assignee of the present invention. Both the '790 and '597 patents are incorporated herein in their respective entireties by reference.

After ion beam processing of the workpiece 24, the workpiece support structure 50 returns the workpiece 24 to a horizontal position and the electrostatic clamp is de-energized to release the workpiece. The arm 62 grasps the workpiece 24 after such ion beam treatment and moves it from the support 50 back into the load lock 60. In accordance with an alternate design the load lock has a top and a bottom region that are independently evacuated and pressurized and in this alternate embodiment a second robotic arm (not shown) at the implantation station 20 grasps the implanted workpiece 24 and moves it from the implantation chamber 22 back to the load lock 60. From the load lock 60, a robotic arm of one of the robots moves the implanted workpiece 24 back to one of the cassettes 70-73 and most typically to the cassette from which it was initially withdrawn.

Ion Source 12

Figure 2:
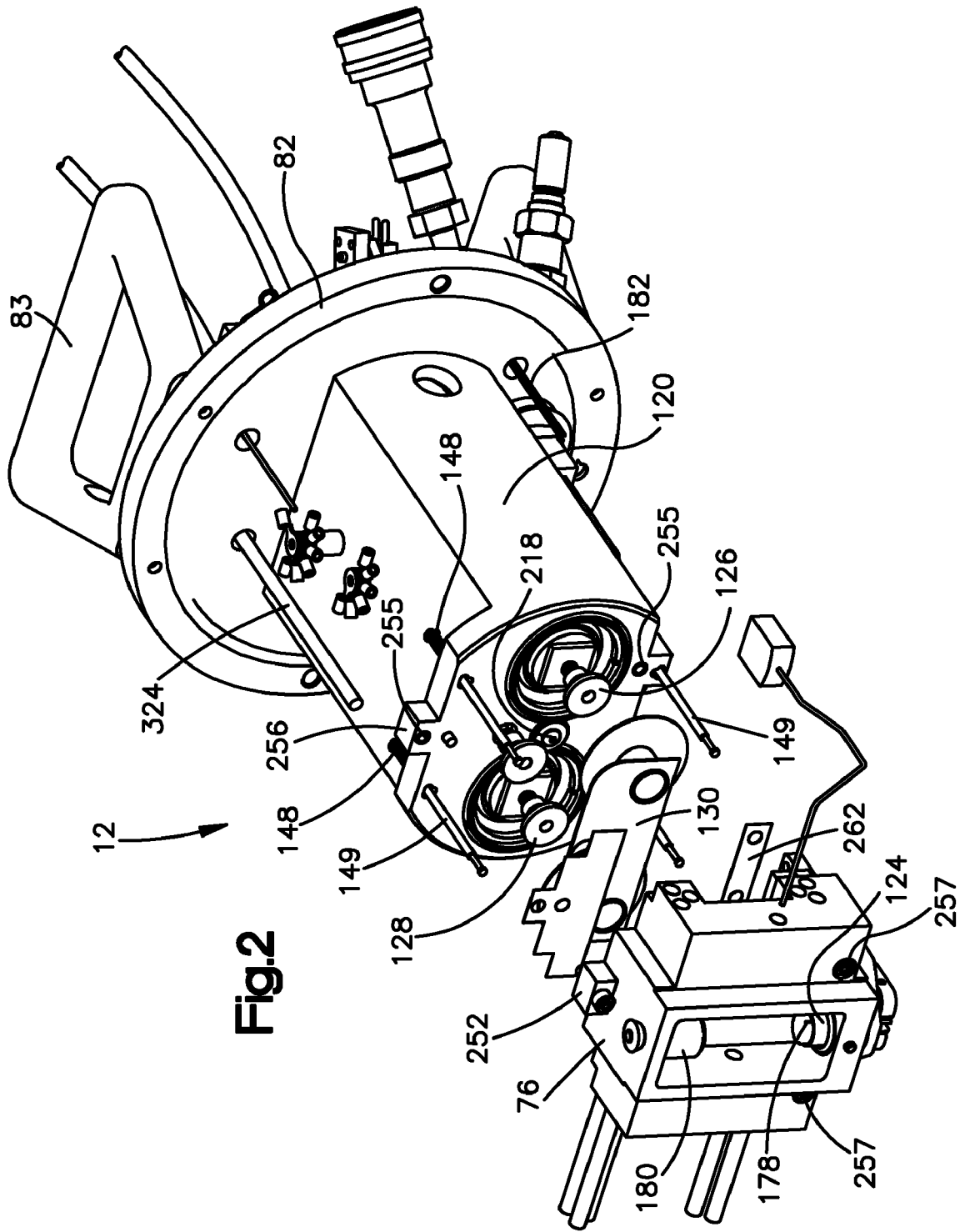
FIG. 2 is a perspective view of an ion source.

The ion generating source 12 illustrated in greater detail in FIG. 2 includes a source block 120 supported by a flange 82 having handles 83 by which the source 12 can be grasped as a unit and removed from the implanter. The source block 120 supports a ion source chamber 76. An electron emitting cathode 124 is supported by but electrically isolated from the ion source chamber 76. Connectors thread through openings 255 in mounting blocks 252, 256 on the chamber 76 and source block 120 to attach the chamber 76 to the source block 120.

A source magnet (Not Shown) encircles the ion source chamber 76 to confine the plasma generating electrons to tightly constrained travel paths within an interior of the ion source chamber 76. The source block 120 also defines cavities that accommodate vaporizer ovens that can be filled with vaporizable solids such as arsenic that are vaporized to a gas and then injected into the ion source chamber 76 by means of delivery nozzles 126, 128 which pass through a heat shield 130. In one embodiment, the ion source chamber 76 is an elongated metal housing made of an aluminum alloy.

Gaseous material can be injected into the interior of the ion source chamber 76 by the delivery nozzles 126, 128 which extend through openings in the source block 120. On a back side of the chamber 76 passageways extend from a rear of the ion source chamber 76 through a chamber body and open into the interior of the ion source chamber 76. The nozzles 126, 128 abut entryways to these passages to deliver gaseous source material from the vaporizer ovens. Additionally, gas can be directly routed into the ion source chamber 76 by means of a port or opening in a rear wall of the chamber 76. A delivery tube (not shown) that extends through the source block injects gas directly into the ion source chamber 76 from a source or supply external to the ion source.

In the exemplary embodiment, an end wall of the ion source chamber defines an opening sized to allow the cathode 124 to extend into an interior of the ion source chamber 76 without touching the chamber wall. The cathode 124 is supported by an insulating mounting block coupled to the rear of the ion source chamber. A cathode body that fits into the opening is mounted to a conductive mounting plate supported by the insulating mounting block.

The cathode 124 is constructed substantially in accordance with the disclosure of U.S. Pat. No. 5,763,890 to Cloutier et al which is assigned to the assignee of the present invention and which is incorporated herein by reference. Briefly, when a tungsten wire filament 178 is energized by application of a potential difference across the power feedthroughs, the filaments emit electrons which accelerate toward and impact the end cap of the cathode 124. When the cap is sufficiently heated by electron bombardment, it in turn emits electrons into the ion source chamber 76 which strike gas molecules and create ions within the chamber 76. A high concentration of ions is created inside the ion source chamber and ions within the chamber exit a selected one of a number of possible openings (typically elongated slots) described below. The choice of aperture is based on the desired characteristics of the ion beam 14 used to implant a given run or sequence of wafers. A cap (not shown) shields the filament from contact with the ions within the chamber and extends the life of the filament.

Electrons generated by the cathode 124 emitted into the ion source chamber 76 but which do not engage a gas molecule within a gas ionization zone move to the vicinity of a repeller 180. The repeller 180 includes a metal member located within the ion source chamber 76 which deflects electrons back into the gas ionization zone where it will probably impact a gas molecule. The metal member of the repeller is made of refractory material. A ceramic insulator insulates the repeller 180 from the electrical potential of an end wall of the ion source chamber 76. The cathode 124 and repeller 180 are therefore electrically and thermally isolated from the chamber walls.

The walls of the ion source chamber 76 are held at a local ground or reference electric potential. The cathode, including the cathode end cap 164 is held at a potential of between 50-150 volts below the local ground of the chamber walls. A feedthrough 182 shown in FIG. 2 supplies power to the cathode. The connection from this feedthrough 182 to the cathode is not shown in the drawings. The filament 178 is held at a voltage of between 200 and 600 volts below that of the cathode. The large voltage difference between the filament and the cathode imparts a high energy to the electrons leaving the filament that is sufficient to heat an end cap and thermionically emit electrons into the chamber 76. The repeller member 180 is allowed to float at the electrical potential of the gas plasma within the chamber 76.

Ion Extraction Aperture

Figure 3:
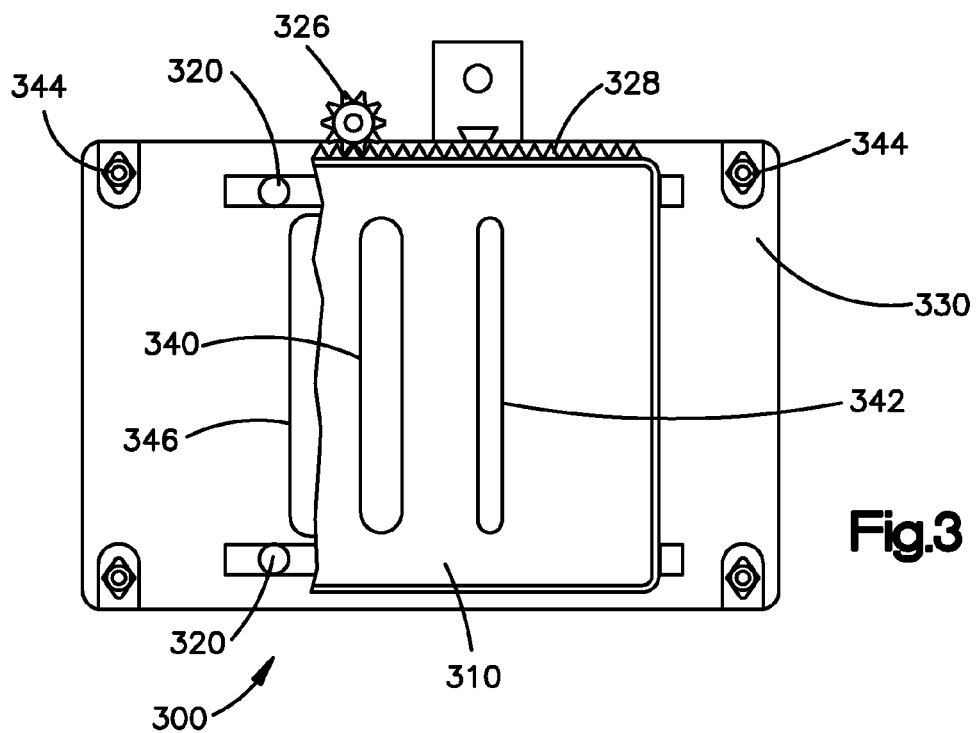
FIG. 3 is a elevation schematic depiction of an extraction wall of an ion implanter source.

An assembly 300 of the ion source 12 is depicted in FIG. 3. The assembly includes an ion extraction aperture plate 310 that partially encloses an ionization region of the chamber 76. A bearing support 320 movably supports the exit aperture plate 310 with respect to the chamber for moving the aperture plate 310 between first and second positions that define different ion beam profiles. A rotating drive or actuator (not shown) is coupled to a gear 326 that drives a rack 328 coupled to the aperture plate 310 for moving the aperture plate back and forth between the first and second positions.

In the FIG. 3 embodiment, the aperture plate has two elongated extraction openings or apertures 340, 342 aligned in generally side by side configuration next to each other. In this embodiment, a fixed mounting plate 330 that abuts the chamber 76 defines an enlarged opening 346 (the same size as the outwardly facing opening in the chamber) overlapped by one or the other of the two openings 340, 342 to define the beam width of ions emerging from the chamber. This allows two different shape ion beams to be created.

Rotating the gear 326 moves the aperture plate in a generally linear path and positions the plate 310 so that one or the other of the two generally aligned slits 340, 342 defines a beam width. In the FIG. 3 embodiment, the assembly 300 mounts in abutting relation to the ion source chamber due to a force of engagement applied by elongated rods 149 biased away from the ion source chamber 76 by springs 148. The rods extend through openings 257 in the chamber 76 beyond a front surface of the chamber and into slots 344 in the mounting plate 330. To mount the plate, the rods are pushed through the slots 344 and connectors are attached to maintain biasing tension in the springs 148.

Figure 4:
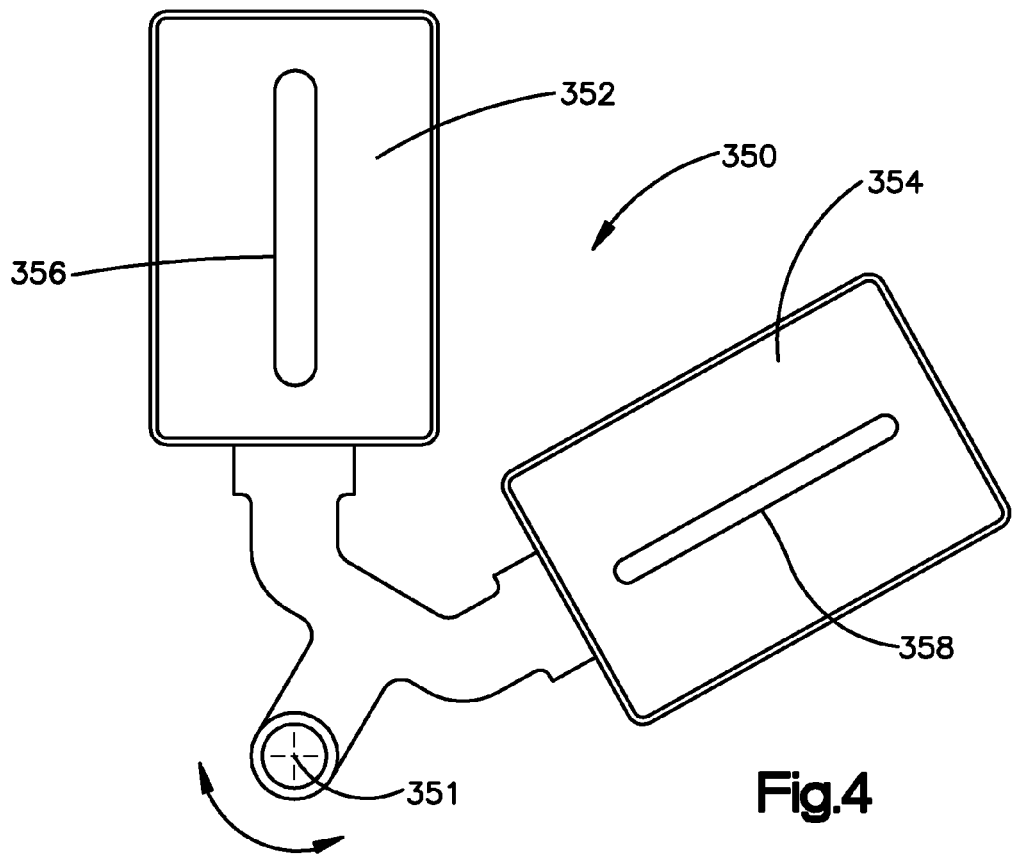
FIG. 4. is a schematic depiction of an alternate ion exit aperture defining plate.

FIG. 4 shows an embodiment wherein the source 12 includes an ion extraction aperture assembly 350 made up of two ion extraction aperture plates 352, 354 for selectively enclosing an ionization region of the chamber 76. The plate 352 defines an ion extraction aperture 356 and the plate 354 defines an ion extraction aperture 358. In this embodiment the two plates 352, 354 are supported by a common support structure for movably supporting the second exit aperture plate with respect to the housing for moving the aperture plate between first and second positions that define different ion beam profiles. In the embodiment of FIG. 4 a drive (not shown) rotates the common support about an axis 351 to position one or the other of the two aperture plates with its ion extraction aperture covering an open wall of the ionization chamber. In the embodiments of FIGS. 3 and 4 the drive is coupled to an output shaft of a drive motor (not shown) aligned with the elongated extent of the drive and having a transmission or coupling attached to one end of the drive for transmitting motive power from the electric motor to the drive. Such a drive motor is supported for example by the flange 82 of the source 12 outside the evacuated region of the ion implanter.

Figure 5:
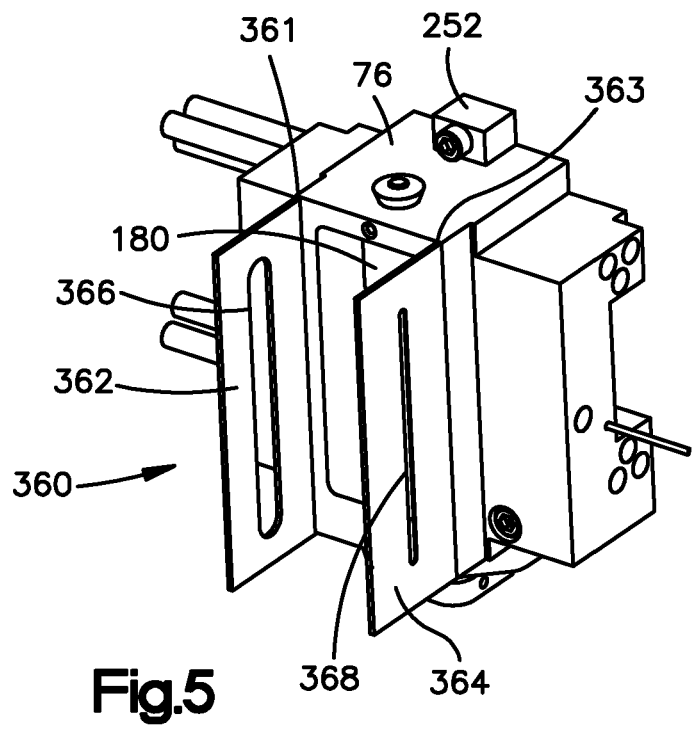
FIG. 5 is a perspective view showing an additional alternate ion exit aperture defining plate.

Turning now to FIG. 5, one sees a second alternate ion extraction aperture assembly 360 of the invention where the ion source chamber 76 is bounded on a forward facing wall by two pivotally mounted metal plates 362, 364 having two different width ion extraction apertures 366, 368. One plate 362 having a wider ion extraction aperture 366 is pivoted about an axis 361 so it can selectively be rotated by a drive (not shown) to selectively cover the ion source chamber and define the beam characteristics of the source. A second ion extraction aperture defining plate 364 has a narrower slit 368 is pivoted about an axis 363 to selectively define a second narrower beam. In these embodiments, the width of the plates is such that they do not interfere with the operation of downstream extraction electrodes for accelerating charged ions leaving the source 12.

Figure 6:
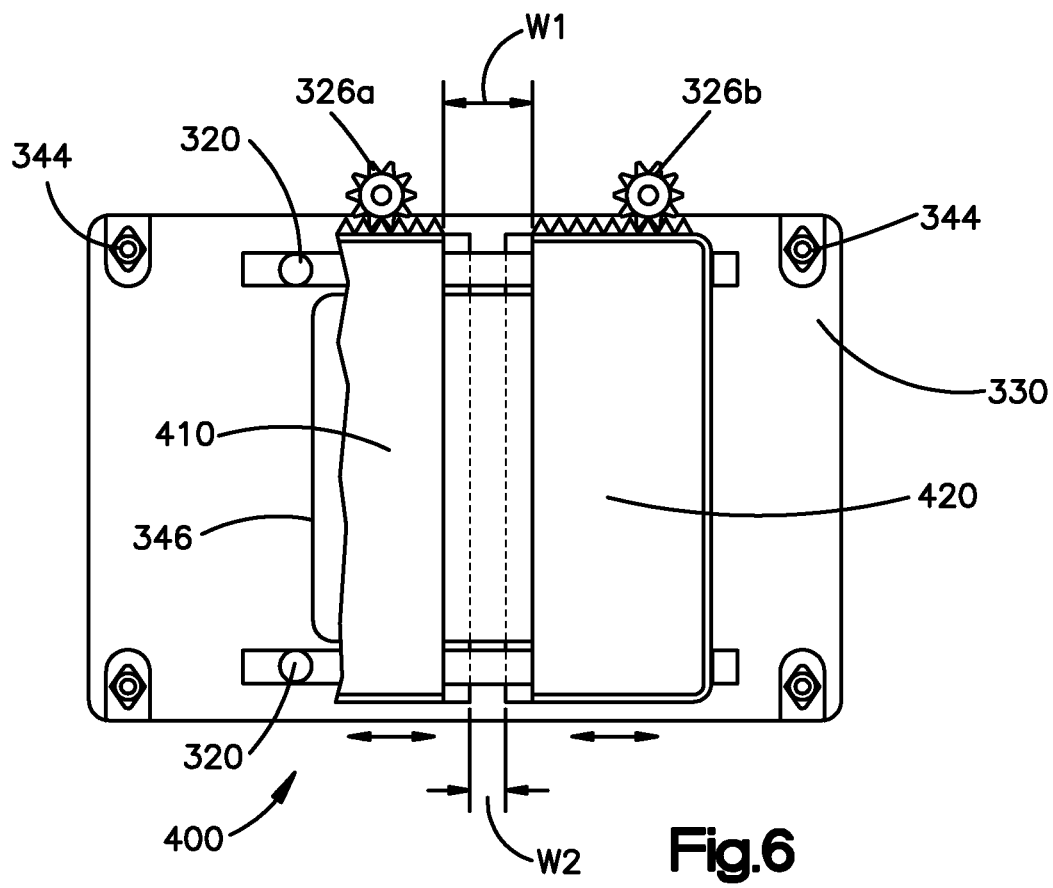
FIG. 6 is an additional alternate embodiment of the invention wherein a separation between two moveable plates defines an extraction aperture.

An alternate assembly 400 of the ion source 12 is depicted in FIG. 6. The assembly includes two ion extraction aperture defining plates 410, 420 that partially enclose an ionization region of the chamber 76. A bearing support 320 movably supports the two plates 410, 420 for generally linear movement with respect to the chamber. The implanter controller is coupled to an appropriate drive for moving the aperture plates 410, 420 in sync with each to different positions that define different extraction apertures having different ion beam profiles. In the exemplary embodiment, the plates 410, 412 move in equal amounts so that a centerline of the aperture does not move. A rotating drive or actuator (not shown) is coupled to two rotatable gears 326a, 326b that drives racks coupled to the aperture plate 410, 420 for moving the aperture plates back and forth to vary the width or spacing between the plates. Two different widths W1, W2 are illustrated in FIG. 6.

In the FIG. 6 embodiment, the aperture plates 410, 420 abut the chamber 76 and at least partially cover an enlarged opening 346. As the plates are moved toward each other the extraction apertures narrow and as the plates are moved apart the aperture widens. This configuration allows many different shape ion beams to be created. As in the FIG. 3 embodiment, the assembly 400 mounts in abutting relation to the ion source chamber due to a force of engagement applied by elongated rods 149 biased away from the ion source chamber 76 by springs 148.

It is presently contemplated that a range of widths of the elongated ion extraction apertures from about 2 mm to 15 mm will be used in generating different type beams with different source materials and different target energies.

From the above description of a preferred embodiment of the invention, those skilled in the art will perceive improvements, changes and modifications. One example is an embodiment wherein two separate ion source chambers 76 would be included and have alternate wall structure. The nature of the ion extraction aperture could vary depending on the source ionization material injected into the chamber interior. During ion implanter operation, one or the other of the chambers would be positioned in an emitting position and the other would be moved to the side. Such improvements, changes and modifications within the skill of the art are intended to be covered by the appended claims.

The invention claimed is:

1. An ion source for use in creating a stream of ions having a selectively optimized ion extraction current density depending on selection of a monomer or molecular source ionization material, comprising:
   an ion source chamber for receiving either monomer or molecular source ionization material, said ion source chamber at least partially bounding an ionization region for creating a high density concentration of ions from the monomer or molecular source ionization material within the ion source chamber;
   a wall for partially enclosing the ionization region of said ion source chamber and providing an ion extraction aperture that permits migration of ions from said ion source chamber having a controlled ion extraction current density, wherein the size and shape of the ion extraction aperture can be controlled as a function of the source ionization material; and
   a drive for moving the wall into operative position with respect to the ion source chamber to allow ions within the ion source chamber to exit through the ion extraction aperture with a selected ion extraction current density, said drive providing the ion extraction aperture with a desired size and shape as a function of the selected monomer or molecular source ionization material.

2. The ion source of claim 1 wherein the wall comprises a movable wall having a plurality of elongated ion extraction apertures of different widths.

3. The ion source of claim 1 wherein the wall comprises first and second wall portions that are moveable to adjust a distance between the walls to adjust a width of the ion extraction aperture.

4. The ion source of claim 3 wherein the first and second wall portions move toward and away from each in synchronism to maintain a center line of a beam of ions as the beam as it exits the ion source.

5. The ion source of claim 2 wherein the movable wall is mounted for generally linear movement within an evacuated region of an ion implanter.

6. The ion source of claim 1 wherein the wall comprises first and second shutters having different ion extraction apertures mounted for movement into and out of position with respect to the ion source chamber.

7. The ion source of claim 6 wherein the shutters are mounted to a common support which rotates a selected one of the shutters into position for allowing ions to exit the ionization region of the ion source chamber.

8. An ion source for use in creating a stream of ions having a selectively optimized ion extraction current density depending on selection of a monomer or molecular source ionization material, comprising:
   an ion source chamber housing for receiving a selected monomer or molecular source ionization material, said chamber housing at least partially bounding an ionization region for creating a high density concentration of ions from the selected monomer or molecular source ionization material within the chamber housing;
   an ion beam extraction assembly having a number of metallic electrodes for creating an ion accelerating electric field;
   an ion extraction aperture plate positioned between the ionization region of said ion source chamber and the ion beam extraction assembly that partially encloses the ionization region of the source chamber housing;
   support structure for movably supporting the ion extraction aperture plate with respect to the housing for moving the ion extraction aperture plate between at least first and second positions that define different ion ion extraction apertures of different size and shape that provide controlled ion extraction current density as a function of the source ionization material; and
   a drive coupled to the ion extraction aperture plate for moving the ion extraction aperture plate between said first and second positions as a function of the selected ionization material.

9. The ion source of claim 8 comprising first and second aperture plates spaced apart by an adjustable gap which defines the different ion extraction apertures.

10. The ion source of claim 8 wherein the ion extraction aperture plate comprises two elongated openings aligned in generally side by side configuration next to each other.

11. The ion source of claim 10 wherein a fixed wall of the ion source chamber defines a third opening that is selectively overlapped by said two elongated openings to narrow a beam width emerging from the chamber.

12. The ion source of claim 10 wherein the drive moves the ion extraction aperture plate in a generally linear path so that one or the other of the two generally aligned elongated openings defines a beam width.

13. The ion source of claim 8 wherein a first extraction aperture extends through a first ion extraction aperture plate and additionally comprising a second ion extraction aperture plate having a second extraction aperture for partially enclosing an ionization region of the chamber; and
   wherein the support structure movably supports the first and second ion extraction aperture plates with respect to the housing to define different ion beam profiles.

14. The ion source of claim 13 wherein the drive moves the first and second ion extraction aperture plates in tandem.

15. A method for generating an ion beam having a selectively optimized ion extraction current density depending on usage of a selected monomer or molecular source ionization material for use with an ion implanter comprising:
 a) positioning a source chamber to provide a high concentration of ions in an ionization region for creating a beam of ions that extends along an ion beam path of travel;
 b) positioning an ion beam extraction assembly having a number of metallic electrodes in relation to the ionization region for creating an ion accelerating electric field for accelerating ions leaving the ionization region;
 c) mounting structure between the source chamber and the ion beam extraction assembly to define an adjustable ion extraction aperture that is multiply configurable for allowing ions to exit the ionization region, accelerate through the accelerating electric field created by the ion beam extraction assembly, and form an ion beam of a defined shape that extends along the ion path of travel within a low pressure region of the ion implanter;
 d) lowering a pressure at a region of the ion source chamber;
 e) ionizing a first monomer or molecular source material within the ion source chamber to provide a first high concentration of ions in an ionization region;
 f) creating a first ion extraction current density by allowing ions from the first high concentration of ions to migrate through an ion extraction aperture having a first size and shape; and
 g) without re-pressurizing the beam path, ionizing a different, second monomer or molecular source material within the ion source chamber to provide a second concentration of ions in the ionization region;
 h) and changing the size and shape of the ion extraction aperture to create a second, different ion extraction current based on a choice of the second monomer or molecular source material as ions from the second concentration of ions exit the source chamber through the ion extraction aperture.

16. The method of claim 15 wherein the mounting comprises movably supporting an ion extraction plate having two ion extraction openings in relation to the high concentration of ions and selectively allowing ions from different ionization material to flow through one or the other of said two ion extraction openings.

17. The method of claim 15 wherein the step of changing the size and shape of the extraction aperture is performed by moving one or more moveable wall portions to adjust a width of the ion extraction aperture.

18. The method of claim 15 comprising movably mounting first and second plates having different ion extraction aperture sizes and shapes and rotating one or the other of the plates into position with respect to a source housing.

19. The method of claim 15 wherein first and second plates having different shaped ion extractions apertures are mounted to a common support for movement to an operative position for defining first and second ion beam extraction current densities.

20. A method for generating an ion beam for use with an ion implanter comprising:
 a) positioning first and second ion source chambers for creating a beam of ions that extends along an ion beam path of travel; said first and second source chambers having first and second different width ion extraction apertures in a wall facing the ion beam path of travel to allow ions from the respective first and second source chambers to migrate through an associated extraction aperture;
 b) positioning an ion beam extraction assembly having a number of metallic electrodes in relation to the ionization region for creating an ion accelerating electric field for accelerating ions leaving an ionization region of the first and second ion source chambers;
 c) lowering a pressure at a region of the first and second ion source chambers;
 d) ionizing a source material within a first ion source chamber to provide a first high concentration of ions in a first ionization region;
 e) creating a first profile beam of ions by allowing ions to migrate through an ion extraction aperture of the first ion source chamber having a first shape and accelerating said ions away from the ion extraction aperture by energizing the ion beam extraction assembly;
 f) without re-pressurizing the beam path, ionizing a source material within a second ion source chamber to provide a second high concentration of ions in a second ionization region;
 g) creating a second profile beam of ions by allowing ions to migrate through an ion extraction aperture of the second ion source chamber having a second shape and accelerating said ions away from the ion extraction aperture by energizing the ion beam extraction assembly.

* * * * *